United States Patent
Vorgert

[11] Patent Number: 6,137,738
[45] Date of Patent: Oct. 24, 2000

[54] METHOD FOR IN-SYSTEM PROGRAMMING OF SERIALLY CONFIGURED EEPROMS USING A JTAG INTERFACE OF A FIELD PROGRAMMABLE GATE ARRAY

[75] Inventor: James Joseph Vorgert, Plano, Tex.

[73] Assignee: Lucent Technologies, Inc., Murray Hill, N.J.

[21] Appl. No.: 09/452,017

[22] Filed: Nov. 30, 1999

[51] Int. Cl.[7] .................................................. G11C 29/00
[52] U.S. Cl. ..................................... 365/201; 365/185.01
[58] Field of Search .............................. 365/51, 63, 201, 365/52, 185.01

[56] References Cited

U.S. PATENT DOCUMENTS 5,270,977  12/1993  Iwamoto ................................ 365/222
5,471,430  11/1995  Sawada et al. ........................ 365/222

*Primary Examiner*—Terrell W. Fears
*Attorney, Agent, or Firm*—Locke Liddell & Sapp LLP

[57] ABSTRACT

A method for programming an electrically erasable programmable read only memory (EEPROM) while mounted on a printed circuit board. The EEPROM is used as a memory storage device for a field programmable gate array (FPGA), which is mounted on the printed circuit board. The board and FPGA have a joint test action group (JTAG) test interface. The FPGA contains a test access port (TAP) and user defined internal scan registers. The method includes providing a connection between the TAP of the FPGA and the EEPROM. Data is provided to the internal scan data registers of the FPGA via the JTAG test interface. Data is transferred via the internal scan data registers to the EEPROM without interrupting operation of the FPGA.

19 Claims, 3 Drawing Sheets

METHOD FOR IN-SYSTEM PROGRAMMING OF SERIALLY CONFIGURED EEPROMS USING A JTAG INTERFACE OF A FIELD PROGRAMMABLE GATE ARRAY

TECHNICAL FIELD OF THE INVENTION

The present invention relates to field programmable gate arrays, and more particularly to a method for programming memory storage devices associated with field programmable gate arrays utilizing a JTAG interface.

BACKGROUND OF THE INVENTION

Static random access memory (SRAM) device based field programmable gate arrays (FPGAs) require that their internal configuration memory be loaded from an external source whenever power is applied to the FPGA. A common approach to provide data to the FPGA is the use of a serial configured electrically erasable programmable read only memory (EEPROM). A FPGA device contains circuitry which allows the FPGA at power-up to read the contents of the EEPROM and load this data into its own configuration memory.

Often it is desirable to change the contents of the serial-configuration EEPROM in order to update the functionality of the FPGA device in a system. Using traditional approaches, system operation must be suspended, power turned off, and the EEPROM physically removed from the system, reprogrammed and replaced. Newer methods allow in-system programming where the EEPROM is not removed from the system to be reprogrammed, but such systems typically require special hardware and interruption of normal system operation. Further, such methods may require the use of proprietary EEPROMs and non-standard interfaces to a printed wiring board.

A need has thus arisen for a method of reprogramming an EEPROM device which provides internal configuration memory for a FPGA without the requirement of special hardware, interruption of normal system operation during the reprogramming process, or special interfaces.

SUMMARY OF THE INVENTION

A method is provided for inputting data in a data storage device. The storage device is used as a memory storage device for an integrated circuit which is mounted on a printed circuit board. The board and the integrated circuit have an interface. The integrated circuit contains an access port and user defined internal scan registers. The method includes providing a connection between the access port of the integrated circuit and the storage device. Data is provided to the internal scan data registers of the integrated circuit via the interface. Data is transferred via the internal scan data registers to the storage device without interrupting operation of the integrated circuit.

A method is further provided for programming an electrically erasable programmable read only memory (EEPROM) while mounted on a printed circuit board. The EEPROM is used as a memory storage device for a field programmable gate array (FPGA), which is mounted on the printed circuit board. The board and FPGA have a joint test action group (JTAG) test interface. The FPGA contains a test access port (TAP) and user defined internal scan registers. The method includes providing a connection between the TAP of the FPGA and the EEPROM. Data is provided to the internal scan data registers of the FPGA via the JTAG test interface. Data is transferred via the internal scan data registers to the EEPROM without interrupting operation of the FPGA.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
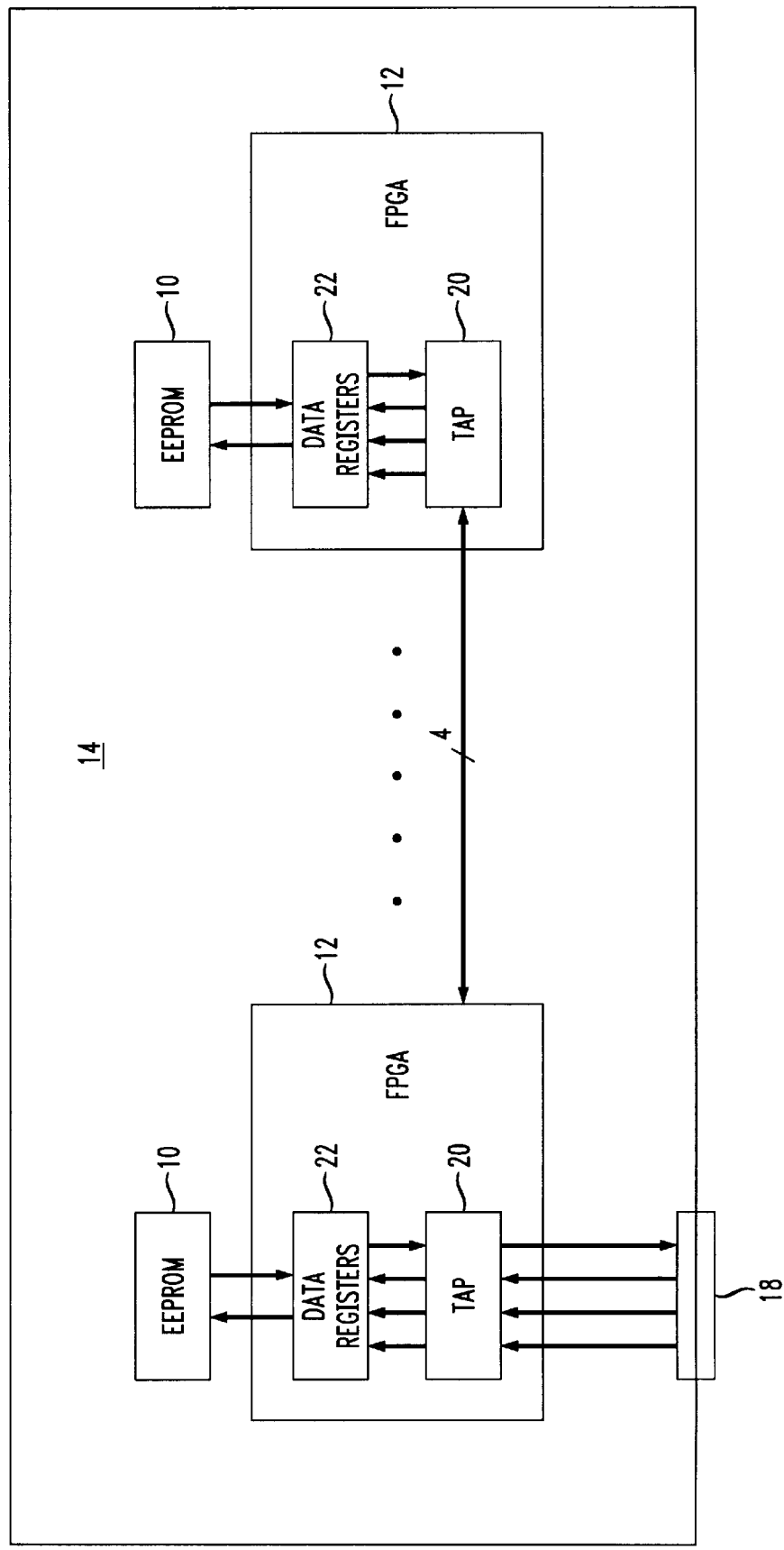
FIG. 1 is a block diagram of a system utilizing the present method.
Figure 2:
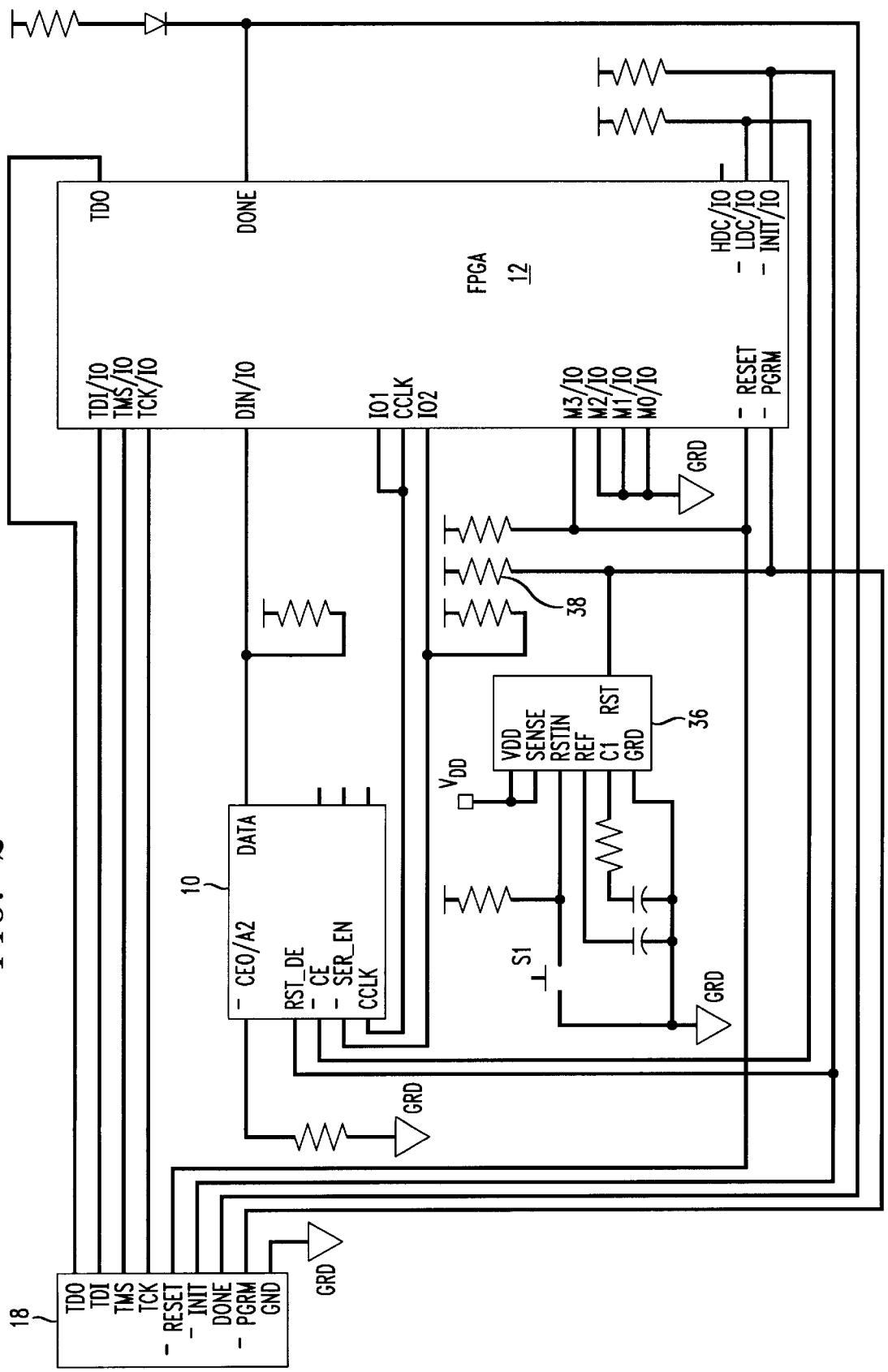
FIG. 2 is a more detailed block diagram of a FPGA utilizing the present method.
Figure 3:
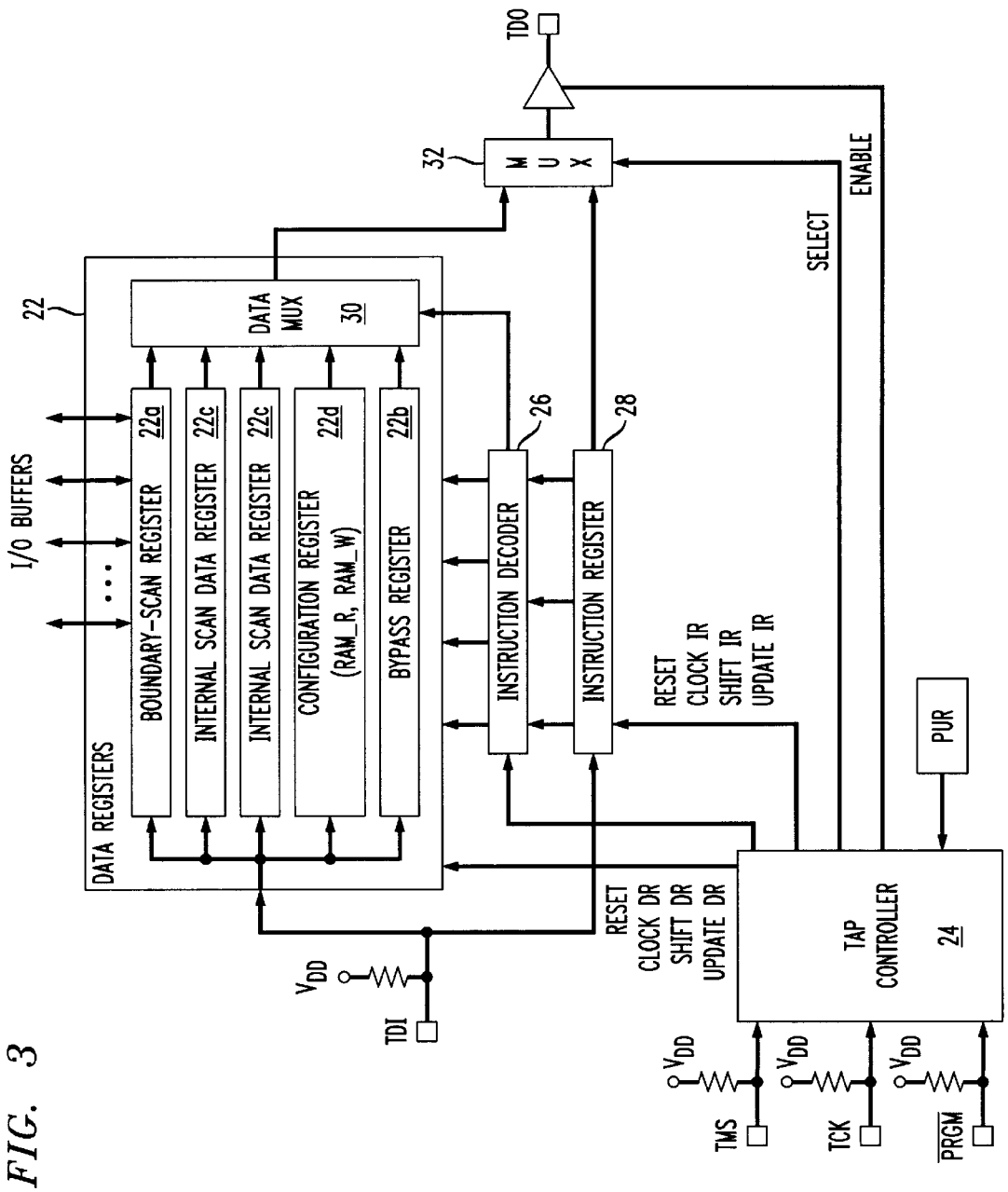
FIG. 3 is a block diagram of data registers of a FPGA.

Referring simultaneously to FIGS. 1, 2, and 3, the present invention provides for in-system programming of parallel or serial-configuration EEPROMs 10 which provide data, such as, for example, internal configuration memory data to FPGAs 12 mounted on a printed wiring board 14. The in-system programming of EEPROMs 10 is accomplished without removal of EEPROM 10 from board 14 for reprogramming and without interruption of normal system operation during the reprogramming process. Although two FPGAs are illustrated in FIG. 1, the present method can be utilized with any number of FPGAs 12 mounted to a printed wiring board 14. FPGA 12 is connected to an interface, such as, for example, a joint test action group (JTAG) test interface 18 which provides an interface to printed wiring board 14 and FPGA 12. JTAG interface 18 provides for four interface pins; test data input (TDI), serial input data; test mode select (TMS), which controls the test access port controller; test clock (TCK); and test data output (TDO), serial data output. Data is serially loaded into FPGA 12 through these four pins via a test access port (TAP) 20 contained within FPGA 12. TAP 20 is defined by IEEE® Standard 1149.1/D1.

While the disclosure illustrates the present invention for use with programming an EEPROM, the present invention may be utilized for programming any type of memory storage device illustratively, flash, DRAM and SRAM devices; EEPROMs 10 being shown for illustrative purposes only and not intended to limit the scope of the present invention. Also, the memory device can be used for any storage function and is not limited to providing internal configuration memory data for a FPGA.

TAP 20 of FPGA 12 provides an interface from JTAG interface 18 to data registers 22 of FPGA 12. Data registers 22 (FIG. 3) include a boundary-scan register 22a, a shift register for controlling the I/O pins of FPGA 12. Data registers 22 further include a bypass register 22b comprising a single flip-flop which allows the serial input data from TDI to be shifted out of the TDO output without interfering with the normal functionality of FPGA 12. A further register within data register 22 is a configuration register 22d which contains the memory of FPGA 12. Data registers 22 further include user-defined internal scan data registers 22c which receive data from TDI and can output data on TDO. The internal scan data registers 22c of FPGA 12 are utilized in the present method. The configuration of data shift registers 22 is controlled by TAP controller 24 to either write the configuration memory or read back its contents. FPGA 12 further includes an instruction decoder 26, instruction register 28 and multiplexers 30 and 32 whose operation are well known to those skilled in the FPGA art.

The internal scan data registers of data registers 22 provide a separate path for data flow from JTAG 18 via TAP 20 to EEPROM 10, without interfering with operation of FPGA 12. EEPROM 10 remains installed on printed wiring board 14 during programming via JTAG 18.

Referring specifically to FIG. 2, EEPROM 10 is connected to FPGA 12 such that FPGA 12 can control EEPROM 10 both during and after self-configuration. When power is applied, PGRM pin of FPGA 12 is initially held low by a power supply supervisor 36. The PGRM pin can also be held low by other means such as, for example, a processor, capacitor, or the like. When the PGRM signal is low, FPGA 12 runs itself-initialization routing, thereby repeatedly clearing its own internal configuration static random access memory (SRAM) cells. At this time, FPGA 12, DONE, INIT, and LDC outputs are driven low while CCLK signal and all user I/O signals are tri-stated. In this configuration, EEPROM 10 is unprogrammed, signal RST_OE is OE active low (default). Therefore, EEPROM 10 data output driver is active during this time, but FPGA 12 is not accepting data. If EEPROM 10 was previously programmed, its RST OE pin will have been set to OE active high and the internal address pointer is reset and the data output is tri-state during initializations.

Once the supply voltage reaches the supervisor 36 trigger threshold and remains stable for a predetermined time period, supervisor 36 or the system releases the PGRM signal and the signal is pulled high through a pull-up resistor 38. Upon the PGRM signal going high, JTAG 18 interface to FPGA 20 becomes active. If the RESET signal is held low at this point, FPGA 12 configuration logic remains in an initialization mode. This sequence preempts self-configuration and allows interaction with FPGA 12 via JTAG interface 18 regardless of the contents of the configuration EEPROM 10. If the RESET signal is high, FPGA 12 completes its current initialization cycle and releases the INIT signal.

On the rising edge of INIT signal, I/O pins M0–M3 inputs are sampled. The state of these pins determines the configuration mode and CCLK speed for FPGA 12.

With INIT high, EEPROM 10 is disabled if EEPROM 10 has not yet been programmed. In this case, FPGA 12 continues to supply CCLK, but never receives a start bit from EEPROM 10. The system remains in this state until FPGA 12 is configured via its JTAG interface 18. If EEPROM 10 was previously programmed, the RST_OE function is now OE active high, and data is clocked out of EEPROM 10 and read into FPGA data registers 22. If there are any errors during this configuration process, FPGA 12 asserts INIT low and halts until the PGRM pin is re-asserted to reset JTAG interface 18 and configuration logic. Once all of the required configuration bits are correctly read, FPGA 12 enters its start-up cycle. All of the pins shown except CCLK and DONE (tri-state), become user I/O (tri-stated if unused), and FPGA 12 begins normal operation.

By default, JTAG interface 18 is inactive during normal operation. When JTAG interface 18 is active, it is used to directly download or read-back the FPGA's 12 configuration SRAM and internal scan chains. Once the FPGA is configured, the internal scan-chain remains inactive until the JTAG interface receives an instruction for internal scan. The user defined internal scan-chain is used to control the states of the control signals connected to the EEPROM 10 and observes responses from the EEPROM 10.

No boundary scan registers are utilized in the present method thereby avoiding disruption of normal system operation and programming can be completed in a short time period. No special circuitry is needed to accomplish the present method, and further the present method can be utilized with a wide variety of EEPROMs.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A method for inputting data in a data storage device adapted to be mounted to a printed circuit board, the board having an interface, the storage device used as a memory storage device for an integrated circuit mounted on the printed circuit board, the integrated circuit having internal scan data registers and an access port, the method comprising:

providing a connection between the access port of the integrated circuit and the storage device;

providing data to the internal scan data registers of the integrated circuit via the interface; and transferring data via the internal scan data registers to the storage device.

2. The method of claim 1 wherein the interface comprises a joint test access group (JTAG) test interface and provides test data input, test mode select, test clock, and test data output signals.

3. The method of claim 1 wherein the access port comprises a test access port (TAP).

4. The method of claim 1 wherein the storage device comprises an electrically erasable programmable read only memory (EEPROM).

5. The method of claim 1 wherein the integrated circuit comprises a field programmable gate array (FPGA).

6. A method for inputting data in a data storage device while mounted on a printed circuit board, the board having a test interface, the storage device used as a memory storage device for a programmable gate array (FPGA), mounted on the printed circuit board, the FPGA having internal scan data registers and an access port, the method comprising:

providing a connection between the access port of the FPGA and the storage device;

providing data to the internal scan data registers of the FPGA via the test interface; and transferring data via the internal scan data registers to the storage device.

7. The method of claim 6 wherein the test interface comprises a joint test access group (JTAG) test interface and provides test data input, test mode select, test clock, and test data output signals.

8. The method of claim 6 wherein the access port comprises a test access port (TAP).

9. The method of claim 6 wherein the storage device comprises an electrically erasable programmable read only memory.

10. A method for programming a data storage device while mounted on a printed circuit board, the board having a joint test access group (JTAG) test interface, the storage device used as a memory storage device for a field programmable gate array (FPGA), mounted on the printed circuit board, the FPGA having internal scan data registers and a test access port (TAP), the method comprising:

providing a connection between the TAP of the FPGA and the storage device;

providing data to the internal scan data registers of the FPGA via the JTAG test interface; and transferring data via the internal scan data registers to the storage device.

11. The method of claim 10 wherein the JTAG test interface provides test data input, test mode select, test clock, and test data output signals.

12. The method of claim 10 wherein the data storage device comprises an electrically erasable programmable read only memory.

13. The method of claim 10 wherein data is transferred to the storage device without interruption of FPGA operation.

14. A method for programming an electrically erasable programmable read only memory (EEPROM) while mounted on a printed circuit board, the board having a joint test access group (JTAG) test interface, the EEPROM used as a memory storage device for a field programmable gate array (FPGA), mounted on the printed circuit board, the FPGA having internal scan data registers and a test access port (TAP), the method comprising:

providing a connection between the TAP of the FPGA and the EEPROM;

providing data to the internal scan data registers of the FPGA via the JTAG test interface; and transferring data via the internal scan data registers to the EEPROM without interrupting operation of the FPGA.

15. The method of claim 14 wherein the JTAG test interface provides test data input, test mode select, test clock, and test data output signals.

16. A circuit comprising:

a data storage device adapted to be mounted to a printed circuit board;

said printed circuit board having a joint test access group (JTAG) test interface a field programmable gate array (FPGA), adapted to be mounting on said printed circuit board, said FPGA having internal scan data registers and a test access port (TAP);

circuitry connecting said data registers to said storage device; and circuitry connecting said data registers to said JTAG test interface via said TAP such that data is transferable via said internal scan data registers to said storage device.

17. The circuit of claim 16 wherein said JTAG test interface provides test data input, test mode select, test clock, and test data output signals.

18. The circuit of claim 16 wherein said data storage device comprises an electrically erasable programmable read only memory (EEPROM).

19. The circuit of claim 16 wherein data is transferred to the storage device without interruption of FPGA operation.

* * * * *